United States Patent
Yang et al.

(10) Patent No.: US 10,714,582 B2
(45) Date of Patent: Jul. 14, 2020

(54) CONTROLLING DIMENSIONS OF A NEGATIVE CAPACITANCE LAYER OF A GATE STACK OF A FIELD-EFFECT TRANSISTOR (FET) TO INCREASE POWER DENSITY

(71) Applicant: QUALCOMM Incorporated, San Diego, CA (US)

(72) Inventors: Bin Yang, San Diego, CA (US); Ye Lu, San Diego, CA (US); Lixin Ge, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/002,459

(22) Filed: Jun. 7, 2018

(65) Prior Publication Data
US 2019/0378904 A1  Dec. 12, 2019

(51) Int. Cl.
| | | |
|---|---|---|
| H01L 29/66 | (2006.01) | |
| H01L 29/78 | (2006.01) | |
| H01L 29/51 | (2006.01) | |
| G11C 11/22 | (2006.01) | |
| H01L 29/423 | (2006.01) | |
| H01L 29/49 | (2006.01) | |

(52) U.S. Cl.
CPC ...... *H01L 29/42376* (2013.01); *G11C 11/223* (2013.01); *H01L 29/4966* (2013.01); *H01L 29/516* (2013.01); *H01L 29/6684* (2013.01); *H01L 29/66689* (2013.01); *H01L 29/7816* (2013.01); *H01L 29/78391* (2014.09)

(58) Field of Classification Search
CPC ......... H01L 29/78391; H01L 29/40111; H01L 29/6684; H01L 29/516; H01L 21/28291; H01L 29/66545; H01L 29/42376; H01L 29/7816; H01L 29/66689; H01L 29/4966; H01L 27/11585–11597; G11C 11/223; G11C 11/22; G11C 5/02–10; G11C 5/14–148; G11C 11/4087; G11C 11/4074
See application file for complete search history.

(56) References Cited

U.S. PATENT DOCUMENTS

| | | |
|---|---|---|
| 8,362,604 B2 | 1/2013 | Ionescu |
| 9,559,168 B2 | 1/2017 | Lai et al. |
| 9,660,067 B2 | 5/2017 | Then et al. |
| 9,831,239 B1 | 11/2017 | Shin et al. |

(Continued)

OTHER PUBLICATIONS

Khan, Asif Islam et al., "Negative capacitance in a ferroelectric capacitor," Nature Materials, vol. 14, No. 2, Feb. 2015, pp. 182-186.

(Continued)

*Primary Examiner* — Nelson Garces
(74) *Attorney, Agent, or Firm* — W&T/Qualcomm

(57) ABSTRACT

A Field-Effect Transistor (FET) with a negative capacitance layer to increase power density provides a negative capacitor connected in series with a conventional positive capacitor. The dimensions of the negative capacitor are controlled to allow the difference in capacitances between the negative capacitor and the positive capacitor to approach zero, which in turn provides a large total capacitance. The large total capacitance provides for increased power density.

15 Claims, 13 Drawing Sheets

(56) References Cited

U.S. PATENT DOCUMENTS

| | | | | |
|---|---|---|---|---|
| 2001/0038117 | A1* | 11/2001 | Haneder | G11C 11/22 |
| | | | | 257/315 |
| 2012/0286348 | A1* | 11/2012 | Tan | H01L 29/7881 |
| | | | | 257/324 |
| 2017/0162702 | A1 | 6/2017 | Hu | |
| 2018/0182860 | A1* | 6/2018 | Lee | H01L 21/823842 |
| 2019/0019875 | A1* | 1/2019 | Tsai | H01L 29/516 |
| 2019/0058049 | A1* | 2/2019 | Then | H01L 29/516 |
| 2019/0229193 | A1* | 7/2019 | Toh | H01L 29/516 |

OTHER PUBLICATIONS

Li, Kai-Shin et al., "Sub-60mV-Swing Negative-Capacitance FinFET without Hysteresis," 2015 IEEE International Electron Devices Meeting (IEDM), Dec. 7, 2015, 4 pages.

Yueng, Chun Wing et al., "Low Power Negative Capacitance FETs for Future Quantum-Well Body Technology," 2013 International Symposium on VLSI Technology, Systems, and Applications (VLSI-TSA), Apr. 22, 2013, 2 pages.

* cited by examiner

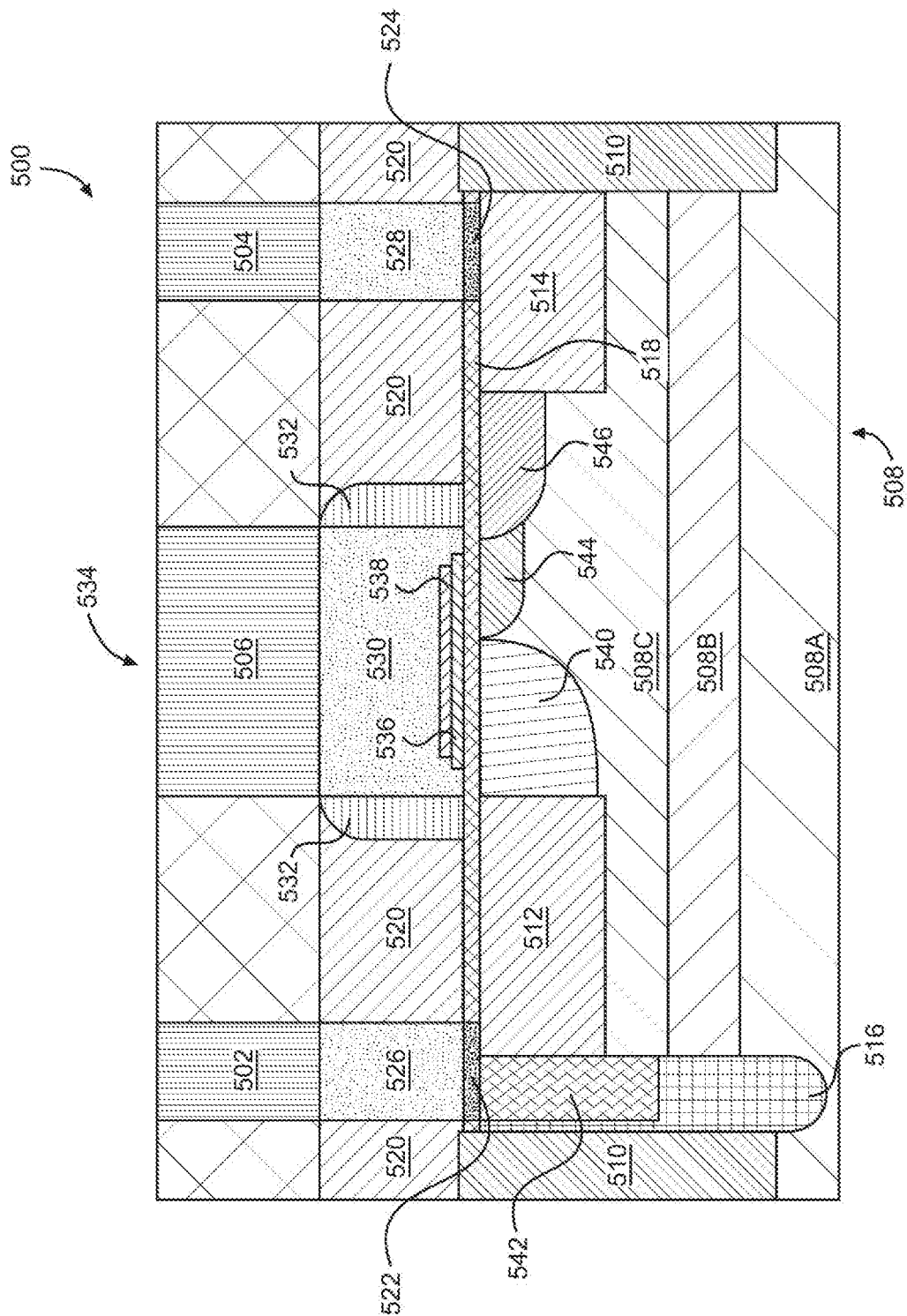

CONTROLLING DIMENSIONS OF A NEGATIVE CAPACITANCE LAYER OF A GATE STACK OF A FIELD-EFFECT TRANSISTOR (FET) TO INCREASE POWER DENSITY

BACKGROUND

I. Field of the Disclosure

The technology of the disclosure relates generally to Field-Effect Transistors (FETs) and, more particularly, to negative capacitance materials in gates of FETs.

II. Background

Field-Effect Transistors (FETs), such as metal-oxide-semiconductor (MOS) FETs (MOSFETs), are switching devices commonly used in a wide array of applications. For example, silicon (Si)-based MOSFETs are often used in high-frequency applications, such as computer logic, and in high-power applications, such as radio frequency (RF) communication devices.

In this regard, FIG. 1 illustrates a conventional Si-based MOSFET 100. The conventional Si-based MOSFET 100 is a three-terminal device that includes a source 102, a drain 104, and a gate 106 over a p-type substrate 108 between two shallow trench isolation (STI) regions 110. The substrate 108 includes an n-type source region 112 under the source 102 and an n-type drain region 114 under the drain 104. The substrate 108 further includes a channel region 116 between the source region 112 and the drain region 114. An insulation layer 118, typically made of silicon dioxide ($SiO_2$), is disposed between the gate 106 and the substrate 108, and a dielectric material layer 120 is disposed over the insulation layer 118. Contacts 122 and 124 are disposed in the insulation layer 118 and below electrodes 126 and 128 of the source 102 and the drain 104, respectively. A gate electrode 130 is disposed between two spacers 132 in the insulation layer 118 and above the channel region 116.

When a gate voltage ($V_g$) is high at the gate 106 and voltage is low at the source 102, an electric field is generated that penetrates the channel region 116 of the substrate 108 and pushes the positive charge carriers in the substrate 108 away from the gate 106. This creates a negatively charged "inversion layer" 134 or "channel" in the channel region 116 at the interface between the insulation layer 118 and the substrate 108. When the gate voltage ($V_g$) exceeds a threshold voltage ($V_t$) and a drain-to-source voltage ($V_{DS}$) is high at the drain 104 and low at the source 102, electrons from the source 102 can flow across the channel, creating a drain-to-source current ($I_{DS}$). In this manner, the MOSFET 100 can be turned on. When the gate voltage ($V_g$) is low at the gate 106, the positive charge carriers of the substrate 108 remain at the interface between the insulation layer 118 and the substrate 108 in such abundance that source and drain PN junctions 136 have a reverse bias. This reduces the width of the channel so drastically that only a very small "leakage current" is able to pass through the channel region 116. In this manner, the MOSFET 100 can be turned off.

With respect to the MOSFET 100 illustrated in FIG. 1, the charge density ($Q_{inv}$) of the inversion layer 134 is a function of the capacitance at the interface between the insulation layer 118 and the substrate 108. This capacitance is sometimes referred to as the oxide capacitance ($C_{ox}$). When the oxide capacitance ($C_{ox}$) is increased, the charge density of the inversion layer ($Q_{inv}$) is also increased, thereby increasing the power density (i.e., the amount of power per unit volume) of the MOSFET 100. In this regard, one way to increase the power density of the MOSFET 100 is to increase its oxide capacitance ($C_{ox}$) by increasing the amount of surface area of the insulation layer 118 in contact with the gate electrode 130. However, increasing the amount of surface area of the insulation layer 118 in contact with the gate electrode 130 can increase the size of the MOSFET 100 itself, which may be undesirable due to scaling preferences. Thus, there is a need to provide FET devices with increased power density without increasing area.

SUMMARY OF THE DISCLOSURE

Aspects disclosed in the detailed description include controlling dimensions of a negative capacitance layer of a gate stack of a Field-Effect Transistor (FET) to increase power density. Similar to a conventional positive capacitor, the capacitance of a negative capacitor is a function of its length, width, and thickness. However, a negative capacitor is distinguished by its ability to decrease the amount of charge on each plate as voltage across it increases. In this manner, a negative capacitor is able to have a negative capacitance. Thus, when a negative capacitor is connected in series with a conventional positive capacitor, the effective capacitance is strongly determined by the absolute difference in capacitance between the two series capacitors. For example, providing a small absolute difference in capacitance between a negative capacitor in series with a conventional positive capacitor can result in a large effective capacitance. Since the dimensions of each capacitor determine its respective capacitance, controlling the dimensions of each capacitor to reduce the difference in capacitance can increase the effective capacitance.

In this regard, in exemplary aspects disclosed herein, a method of controlling dimensions of a negative capacitance layer of a gate stack of a FET to increase power density includes forming two outer spacers over an insulation layer a first length apart from one another. Two inner spacers are then formed over the insulation layer and on the inner walls of the two outer spacers at a second length less than the first length apart from one another. A negative capacitance layer is then formed over the insulation layer between the two inner spacers to a third length less than or equal to the second length. The inner spacers are then removed to expose two portions of the top surface of the insulation layer, wherein each exposed portion is between one of the outer spacers and the negative capacitance layer. A gate electrode is then formed over the negative capacitance layer and the two exposed portions of the top surface of the insulation layer. In this manner, the absolute difference between the capacitance of the negative capacitance layer and the capacitance of the insulation layer can be controlled by controlling the dimensions (i.e., length, width and thickness). The distance between the two inner spacers may be varied to vary the length of the negative capacitance layer providing a relatively high degree of precision for adjusting the capacitance. By providing a reduced absolute difference between the capacitance of the negative capacitance layer and the capacitance of the insulation layer, the oxide capacitance ($C_{ox}$) of the FET can be increased. In this manner, the charge density of the inversion layer ($Q_{inv}$) can be increased, thereby increasing the drain-to-source current ($I_{DS}$) of the FET and, thus, providing increased power density in the FET without requiring additional area.

In this regard, in one exemplary aspect, a FET including a substrate including a channel region between a source region and a drain region is provided. A source of the FET is included over and coupled to the source region and a drain of the FET is included over and coupled to the drain region. A gate including a gate stack is provided over the channel region. The gate stack includes a gate electrode, a negative capacitance layer, and an insulation layer. The gate electrode has a first length between a first spacer and a second spacer. The negative capacitance layer is below the gate electrode and has a second length less than the first length. The insulation layer is below the negative capacitance layer and over the channel region.

In another exemplary aspect, a FET including a substrate including a channel region between a source region and a drain region is provided. The FET includes a means for providing electrical current over and coupled to the source region of the substrate, and a means for receiving electrical current over and coupled to the drain region of the substrate. The FET also includes a means for controlling electric current over the channel region. A gate stack of the means for controlling electric current includes a means for providing electric field for controlling electric current over the channel region. The means for providing electric field for controlling electric current has a first length between a first spacer and a second spacer. The gate stack also includes a means for providing negative capacitance having a second length less than the first length, below the means for providing electric field for controlling electric current. The gate stack also includes a means for dispersing electric field below the means for providing negative capacitance and over the channel region.

In another exemplary aspect, a method of fabricating a FET is disclosed. The method of fabricating the FET includes providing a substrate including a source region, a drain region, and a channel region between the source region and the drain region. An insulation layer is formed over the channel region of the substrate and a first and a second outer spacer are formed over the substrate. In this regard, a first length is defined from an inner wall of the first outer spacer to an inner wall of the second outer spacer. Once the insulation layer is formed, a first inner spacer is formed over the inner wall of the first outer spacer and over a first portion of a top surface of the insulation layer. Similarly, a second inner spacer is formed over the inner wall of the second outer spacer and over a second portion of the top surface of the insulation layer. In this regard, a second length less than the first length is defined from an inner wall of the first inner spacer to an inner wall of the second inner spacer. After the inner spacers are formed, a negative capacitance layer is formed over a third portion of the top surface of the insulation layer to a third length less than or equal to the second length between the inner wall of the first inner spacer and the inner wall of the second inner spacer. The method further includes removing the first and the second inner spacers, and forming a gate electrode over the negative capacitance layer and over the first and the second portions of the top surface of the insulation layer to the first length between the inner wall of the first outer spacer and the inner wall of the second outer spacer.

BRIEF DESCRIPTION OF THE FIGURES

FIG. 5 illustrates an exemplary laterally diffused MOSFET (LDMOS) with a gate stack having a negative capacitance layer according to an exemplary aspect of the present disclosure.

DETAILED DESCRIPTION

Figure 1:
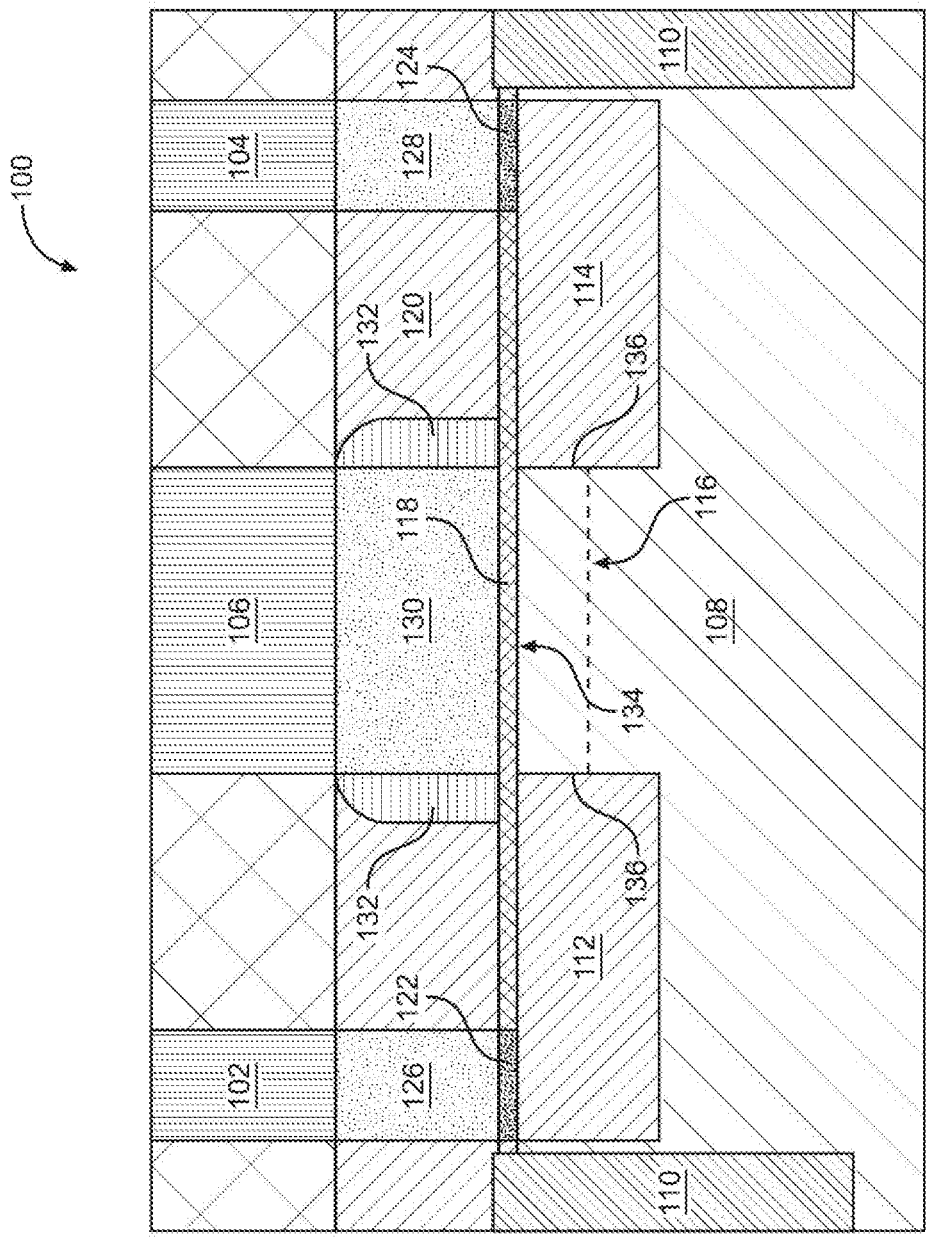
FIG. 1 is a schematic diagram of an exemplary conventional metal-oxide-semiconductor (MOS) Field-Effect Transistor (FET) (MOSFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Before discussing embodiments related to controlling dimensions of a negative capacitance layer of a gate stack of a Field-Effect Transistor (FET) to increase power density, capacitance is discussed generally to provide a background for negative capacitors. A discussion of exemplary aspects of the present disclosure begins below with reference to FIG. 2A.

Generally, capacitors include a dielectric material between two plates, upon which charge can accumulate. The capacitance of a given capacitor is the rate of increase of charge with voltage. Thus, in a conventional capacitor, charge increases on each plate of the capacitor as voltage increases. The capacitance of a capacitor is defined by the following equation:

$$C = \varepsilon \frac{A}{T}$$

where c is the permittivity of the material between the two plates, A is the surface area of the plate, and T is the thickness of the material between the two plates. The capacitance of a single plate can be calculated by treating the plate as an individual capacitor defined by the same equation. Adding two capacitors in series, therefore, allows the capacitance ($C_1$) of one plate to be added to the capacitance ($C_2$) of another plate, as governed by the following equation:

$$C_{Total} = \frac{C_1 C_2}{C_1 + C_2}$$

This equation similarly applies to negative capacitors. Negative capacitors are defined by having the ability to decrease the amount of charge on each plate as voltage increases (i.e., turning the addition in the denominator of the above equation to subtraction in the equation below).

$$C_{Total} = \frac{C_1 C_2}{C_1 - C_2}$$

Similar to a conventional capacitor, the capacitance of a negative capacitor can be controlled by controlling its thickness and surface area (width or length). Generally, negative capacitors are made out of ferroelectric materials because ferroelectric materials allow for such behavior. Specifically, since ferroelectric materials are defined by having a central atom of a unit cell that is not at the center of symmetry, each unit cell of a ferroelectric material has a spontaneous polarization. The direction of the polarization of the ferroelectric material can be switched by applying an electric field that is greater than the coercivity of the ferroelectric material. In this manner, a phase transition of the polarization of the ferroelectric material can be induced.

During the phase transition, the central atom of the unit cell of the ferroelectric material passes from one side of the unit cell to another, thereby changing the polarization of the unit cell. However, during this phase transition, the central atom of the unit cell can be approximately at the symmetric center of the unit cell. When the central atom is approximately at the symmetric center of the unit cell, an energy landscape of the unit cell is at a local maximum. In the region surrounding the local maximum of the energy landscape, the capacitance of the unit cell is negative. In other words, when a voltage pulse is applied to the ferroelectric capacitor, the voltage across the ferroelectric capacitor is found to be decreasing with time—in exactly the opposite direction to which voltage for a regular capacitor should change. In this regard, a negative capacitor is able to have a negative capacitance.

With regard to the operation of a FET, the power (P) of a FET is a function of the drain-to-source voltage ($V_{DS}$) and the drain-to-source current ($I_{DS}$). One way to increase the power of a FET is to increase the drain-to-source voltage ($V_{DS}$). However, the power of a FET can also be increased by increasing the drain-to-source current ($I_{DS}$). Since current is the rate of flow of charge per unit time, increasing the charge density of the current (i.e., the charge density of the inversion layer ($Q_{inv}$)) can increase the power density of the FET. In this regard, increasing the oxide capacitance ($C_{ox}$) of the FET can increase the power density of the FET.

Exemplary aspects of the present disclosure add a layer of negative capacitance material to a gate stack to be positioned adjacent to and on top of a traditional oxide layer to form serial capacitance with the traditional oxide layer. The total capacitance is, as noted above:

$$C_{Total} = \frac{C_1 C_2}{C_1 - C_2}$$

where $C_1$ is the capacitance of the traditional oxide layer and $C_2$ is the capacitance of the negative capacitance layer. Recognizing that as $C_2$ approaches $C_1$, the value of the denominator approaches zero. Division by a value close to zero produces a large value. Thus, dividing $C_1 C_2$ by a value close to zero results in a large $C_{Total}$, which provides the desired increase in power density.

Exemplary aspects of the present disclosure provide a FET and techniques for fabricating a FET whose $C_2$ value is controlled to be close to the $C_1$ value of the traditional oxide layer to provide a high capacitance and correspondingly high-power density. As noted above, capacitance (C) is a function of area (A) (width multiplied by length) divided by thickness (T). Exemplary aspects of the present disclosure specifically provide techniques to manage the length of the negative capacitance layer to control the capacitance of the negative capacitance layer to provide the desired negative capacitance. By controlling the magnitude of the negative capacitance, $C_2$ may be fabricated to approximately equal the magnitude of the capacitance $C_1$, resulting in a comparatively high-power density in small node size FETs.

Figure 2A:
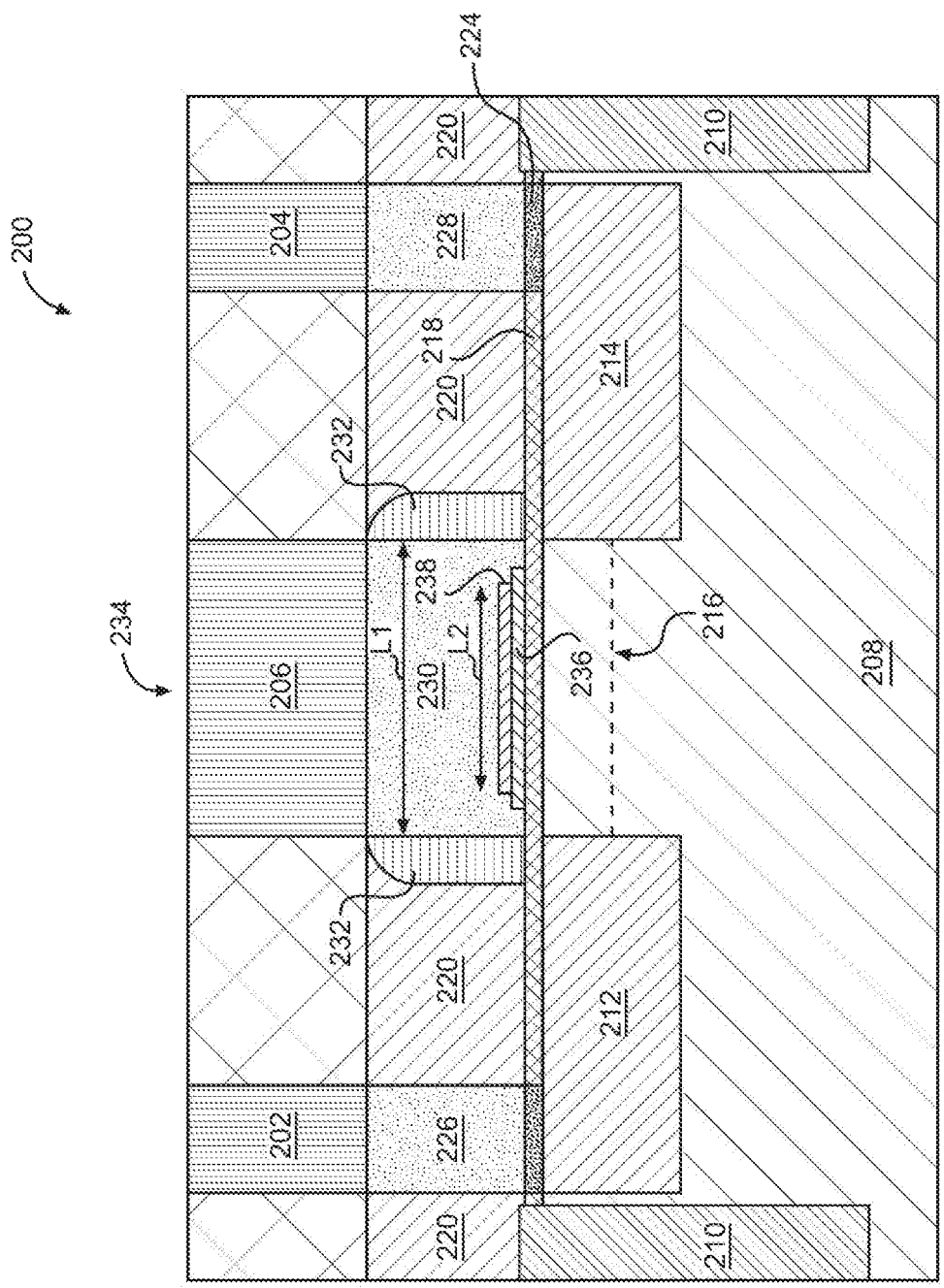
FIG. 2A is a cross-sectional, side elevational view diagram of an exemplary FET having a negative capacitance layer formed according to aspects of the present disclosure.
Figure 2B:
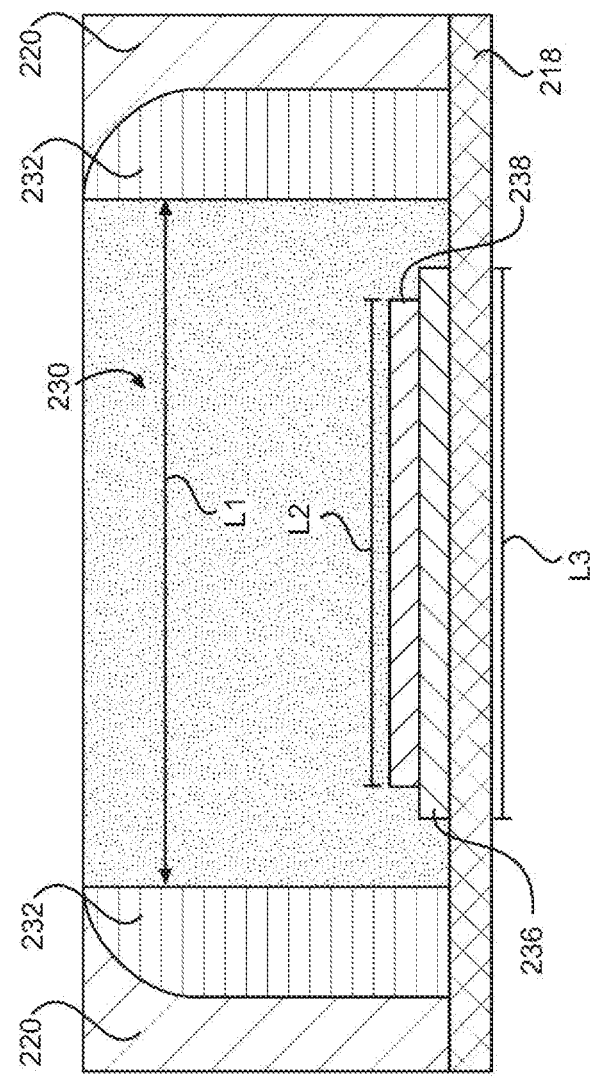
FIG. 2B is an enlarged cross-sectional, side elevational view diagram of the FET of FIG. 2A with a gate stack structure having a negative capacitance layer emphasized.
Figure 3:
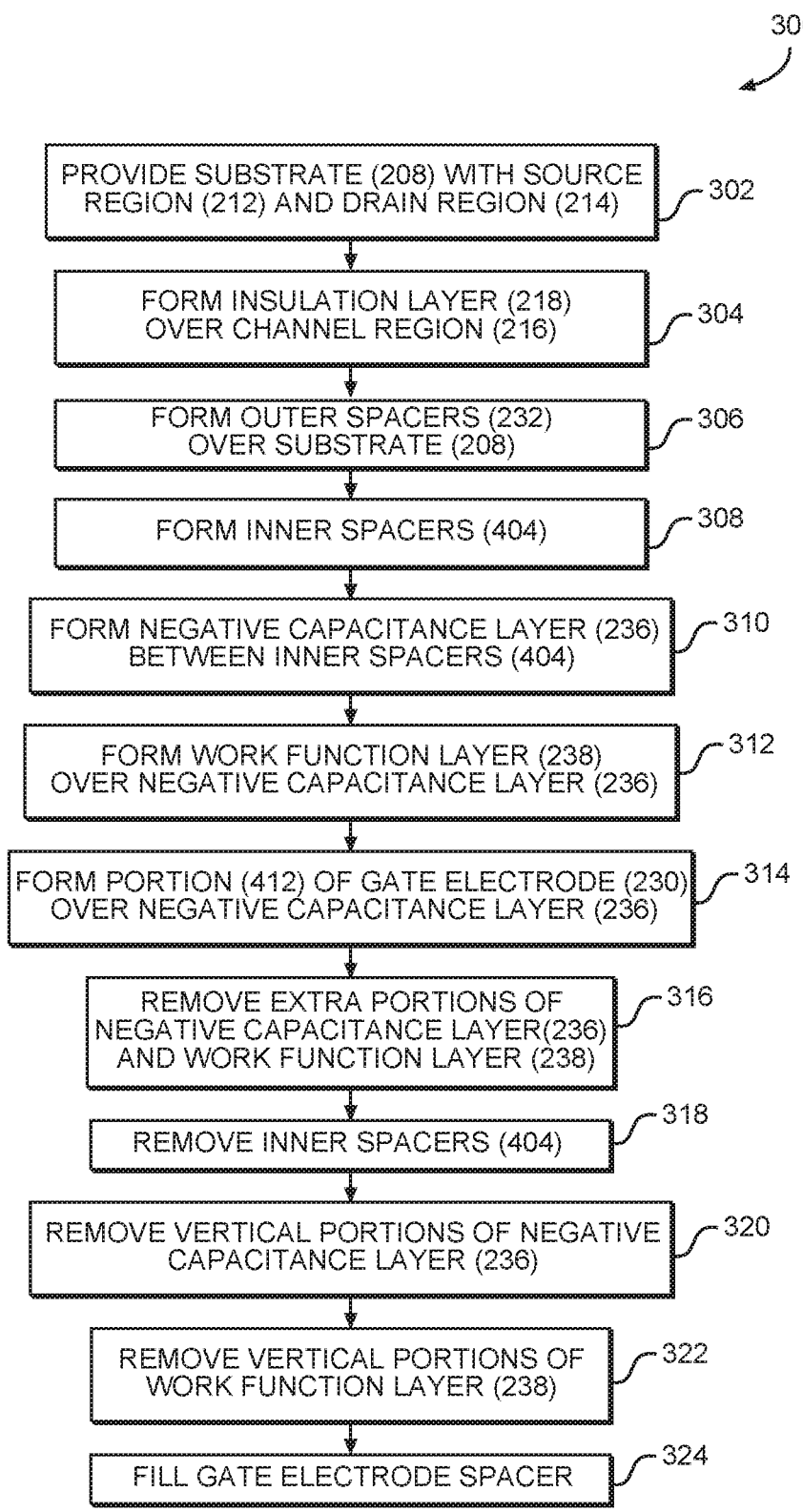
FIG. 3 is a flowchart illustrating an exemplary process of fabricating the FET in FIGS. 2A and 2B.

In this regard, FIGS. 2A, 2B, and 5 illustrate exemplary FETs fabricated according to a process outlined in FIG. 3. FIGS. 4A-4G illustrate specific process stages of the process of FIG. 3.

In this regard, FIG. 2A illustrates a FET 200. The FET 200 is a three-terminal device that includes a source 202, a drain 204, and a gate 206 over a p-type substrate 208 between two shallow trench isolation (STI) regions 210. The substrate 208 includes an n-type source region 212 under the source 202 and an n-type drain region 214 under the drain 204. The source 202 may sometimes be referred to as a means for providing electrical current over and coupled to the source region 212. Likewise, the drain 204 may sometimes be referred to as a means for providing electrical current over and coupled to the drain region 214. The substrate 208 further includes a channel region 216 between the source region 212 and the drain region 214. An insulation layer 218, typically made of silicon dioxide ($SiO_2$), is disposed between the gate 206 and the substrate 208. The insulation layer 218 may sometimes be referred to as a means for insulating. Thus, the insulation layer 218 is over the channel region 216. A dielectric material layer 220 is disposed over the insulation layer 218. Contacts 222 and 224 are disposed in the insulation layer 218 and below electrodes 226 and 228 of the source 202 and the drain 204, respectively. A gate electrode 230 is disposed between two spacers 232.

Collectively, the gate 206 and the gate electrode 230 form a gate stack 234. Within the gate stack 234, the gate electrode 230 has a first length L1 defined by the distance between the spacers 232. Within the gate electrode 230, a negative capacitance layer 236 is positioned on top of and adjacent to (or directly positioned on) the insulation layer 218. A work function layer 238 is positioned on top of and adjacent to (or directly positioned on) the negative capacitance layer 236. The work function layer 238 has a second length L2, which is less than L1 (better seen in FIG. 2B). Likewise, as illustrated in FIG. 2B, the negative capacitance layer 236 has a third length L3, which is less than L1, but greater than L2.

Exemplary aspects of the present disclosure select the third length L3 to cause the negative capacitance layer 236 to have a desired negative capacitance whose magnitude is approximately equal to the capacitance of the insulation layer 218. As noted above, by having the magnitude of the negative capacitance approximately equal to the magnitude of the capacitance of the insulation layer 218, a small denominator is created and $C_{Total}$ is relatively large, which provides for a relatively high-power density for the FET 200.

Exemplary aspects of the present disclosure provide a process 300, illustrated in FIG. 3 with individual process steps further illustrated in FIGS. 4A-4G to fabricate the FET 200 having the negative capacitance layer 236 to provide an improved power density for the FET 200. In this regard, the process 300 begins by providing the substrate 208 with the source region 212 and the drain region 214 therein (block 302). The channel region 216 extends between the source region 212 and the drain region 214. Note that the substrate 208 may further include one or more STI regions 210. The process 300 continues by forming the insulation layer 218 over the channel region 216 (block 304). In an exemplary aspect, the insulation layer 218 is $SiO_2$ and may have a thickness of about 0.1 nanometers (nm) to 10 nm. A sacrificial material (not shown) may be grown over the insulation layer 218 in what will ultimately be the shape of the gate stack 234. The spacers 232 (also referred to as outer spacers) are formed (block 306) on either side of the sacrificial material over the substrate 208. In an exemplary aspect, the spacers 232 are approximately 0.1 nm to 0.5 micrometers (μm) wide. In an exemplary aspect, the spacers 232 are grown on the sacrificial material as is well understood. Then the dielectric material layer 220 may be deposited around the spacers 232. The sacrificial material may be etched away leaving an intermediate product 400A, illustrated in FIG. 4A. In particular, a void 402 corresponding to the gate stack 234 is illustrated between the spacers 232. The void 402 has a dimension corresponding to the length L1 between the spacers 232. In an exemplary aspect, the length L1, which is also the width of the gate electrode 230, may be about 1 nm to 10 μm.

Figure 4A:
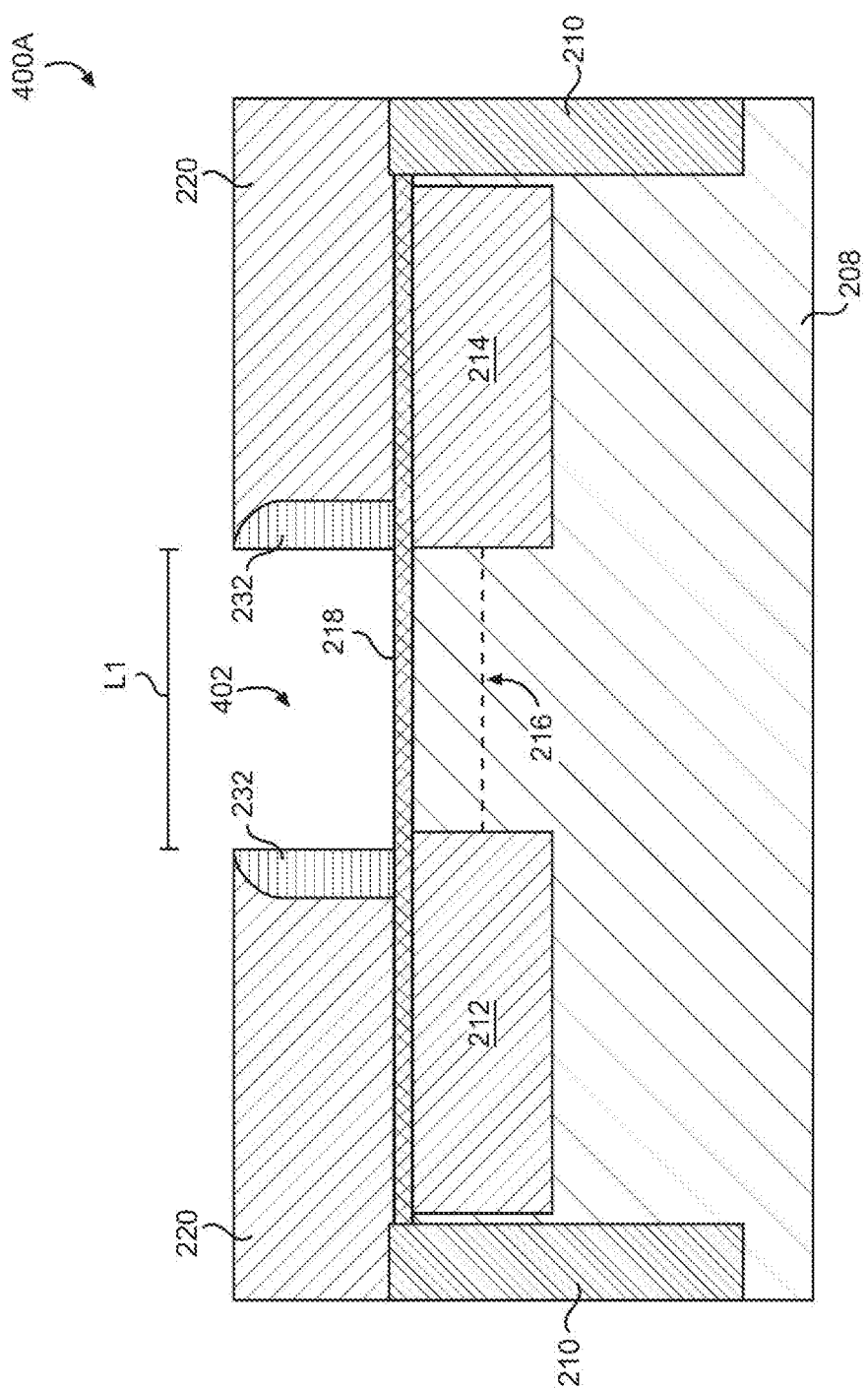
FIG. 4A is a cross-sectional, side elevational view diagram illustrating an exemplary early process stage for forming a gate stack according to the exemplary fabrication process in FIG. 3.
Figure 4B:
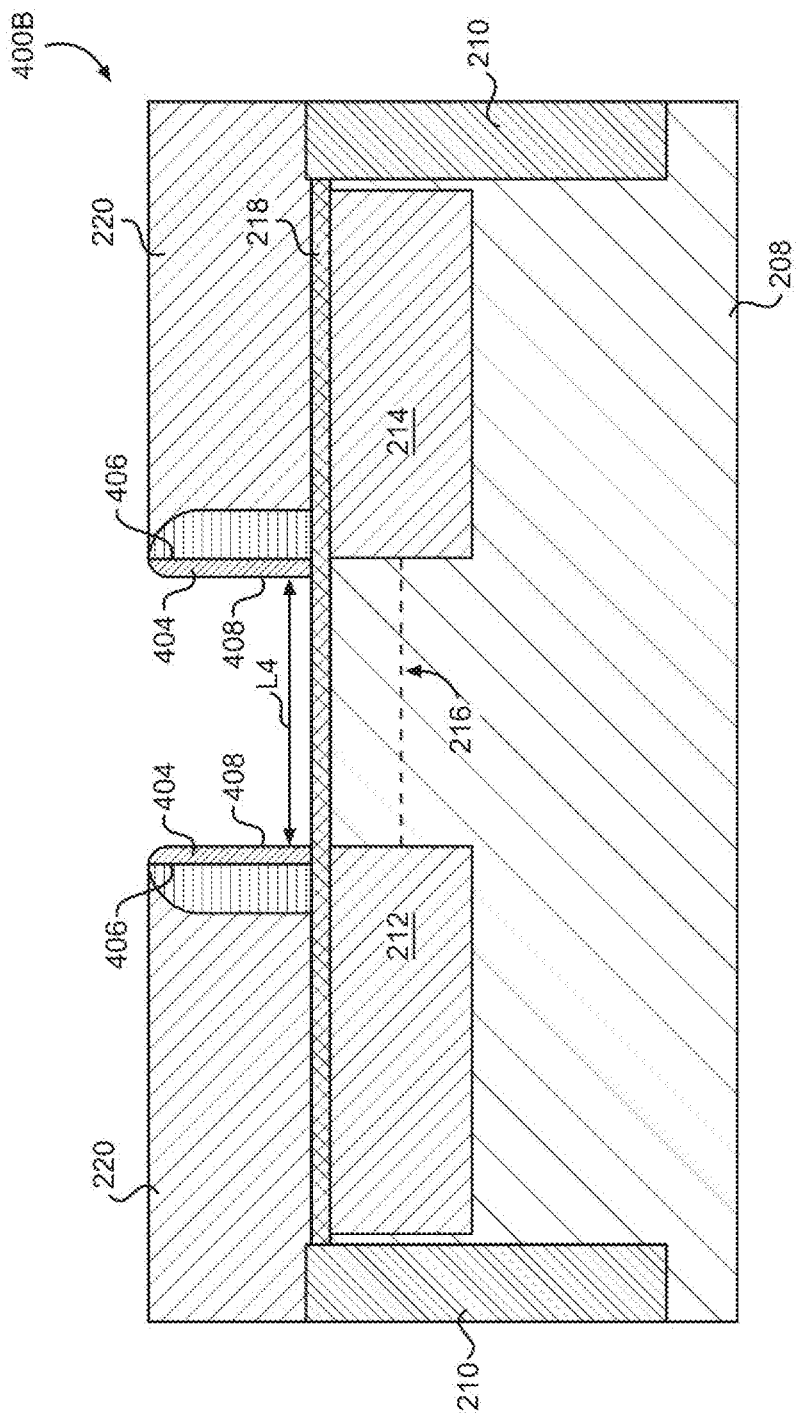
FIG. 4B is a cross-sectional, side elevational view diagram illustrating the addition of inner spacers during formation of the gate stack according to the exemplary fabrication process in FIG. 3.
Figure 4C:
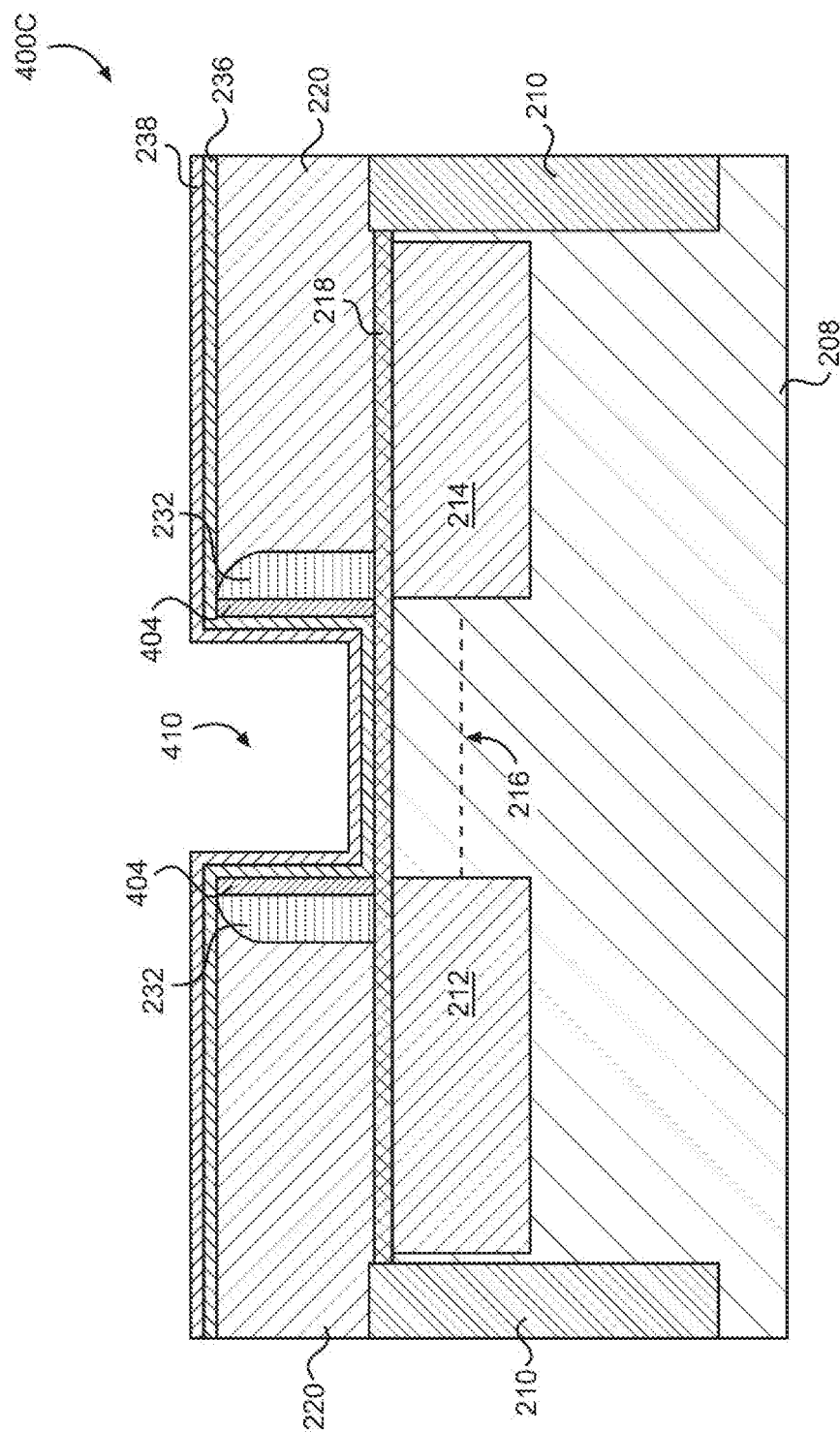
FIG. 4C is a cross-sectional, side elevational view diagram illustrating an exemplary process stage of adding layers that form a capacitance in the gate stack according to the exemplary fabrication process in FIG. 3.
Figure 4D:
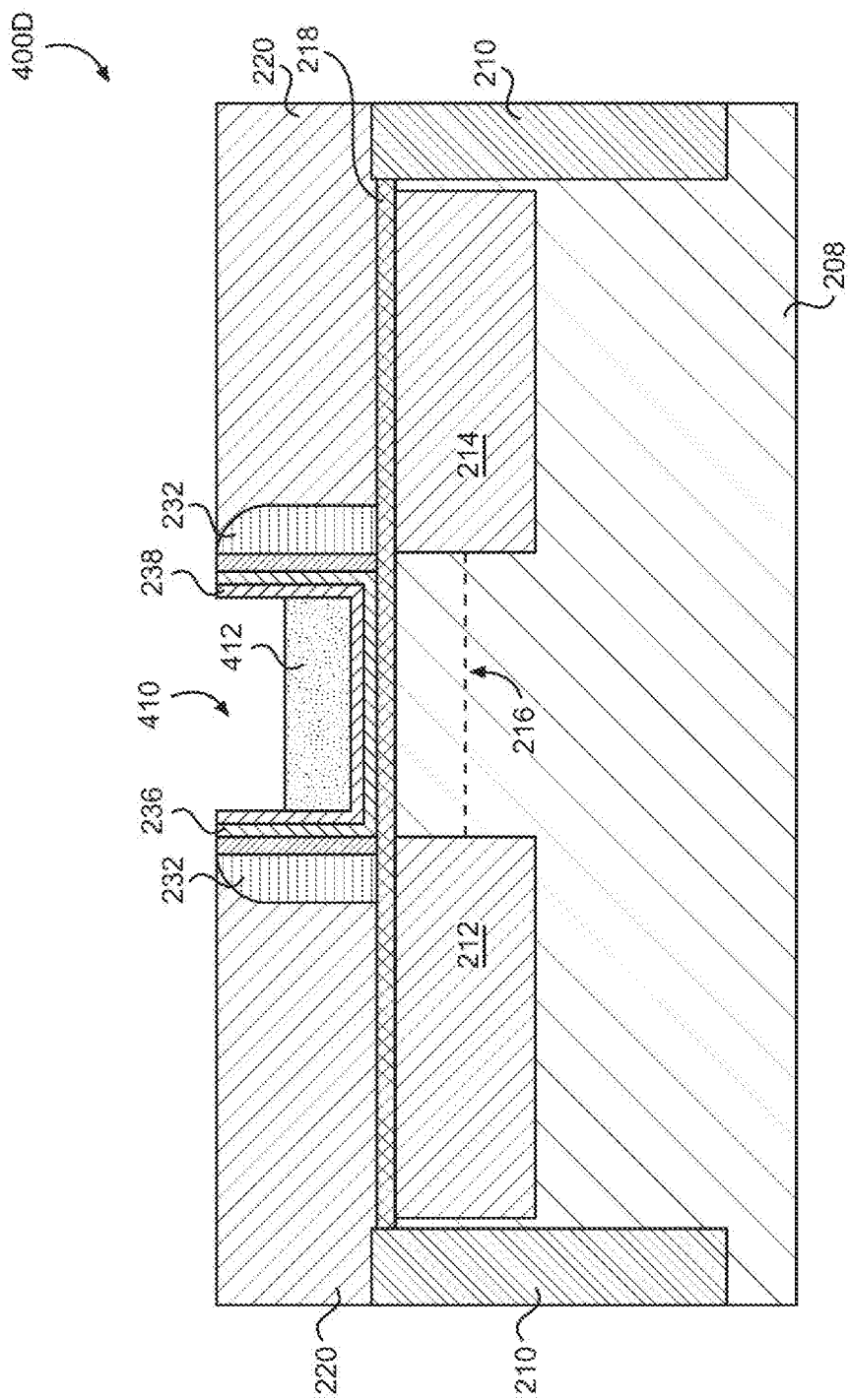
FIG. 4D is a cross-sectional, side elevational view diagram illustrating an exemplary process stage of adding a gate metal during gate stack formation according to the exemplary fabrication process in FIG. 3.
Figure 4E:
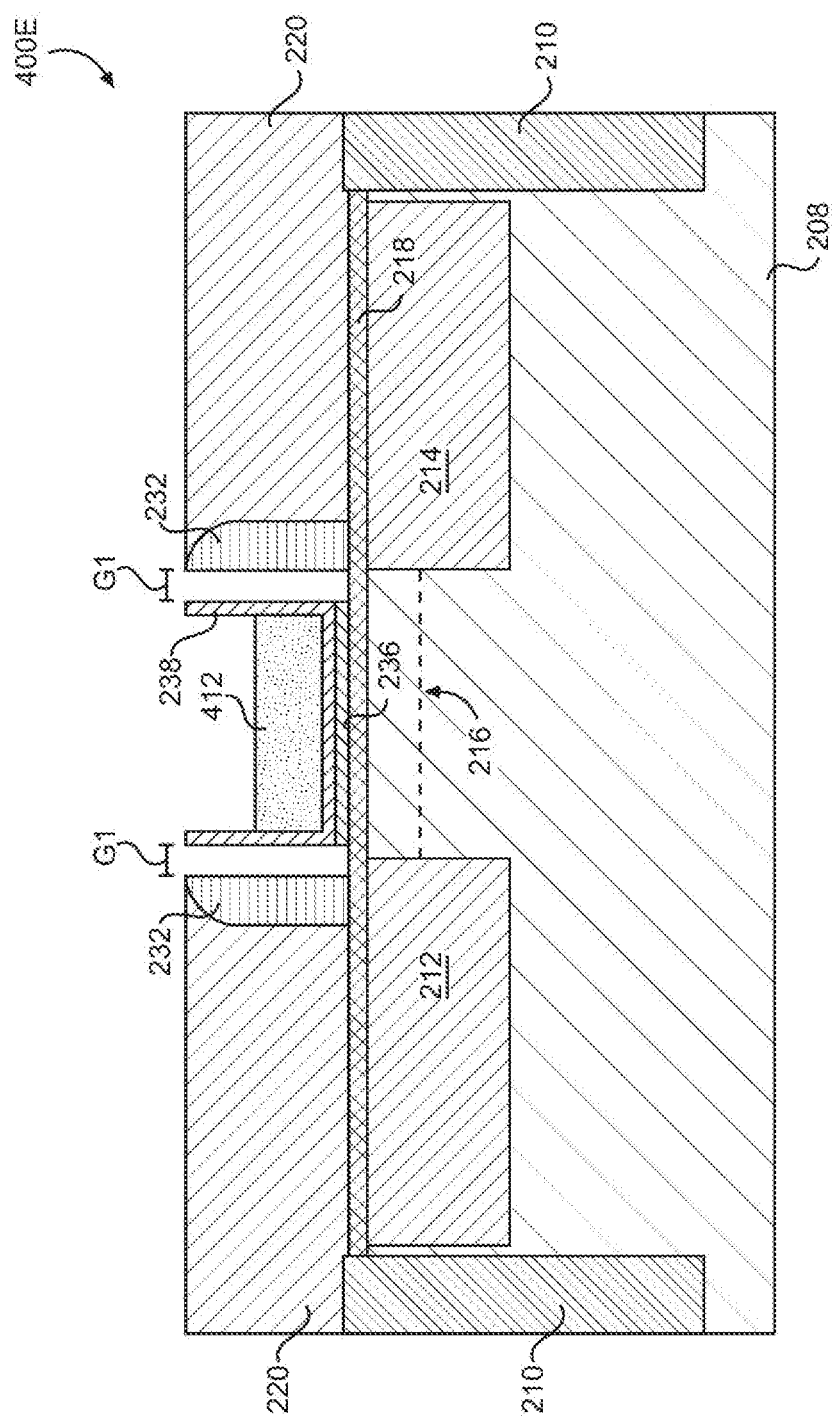
FIG. 4E is a cross-sectional, side elevational view diagram illustrating an exemplary process stage of removing the inner spacers and part of a negative capacitance layer during gate stack formation according to the exemplary fabrication process in FIG. 3.

With continued reference to FIG. 3, inner spacers 404 are formed (block 308) to make intermediate product 400B illustrated in FIG. 4B, such as by growing the inner spacers 404 on interior surfaces 406 of the spacers 232. The inner spacers 404 define a length L4 between interior surfaces 408. As should be readily understood, the length L4 is shorter than the length L1. In an exemplary aspect, the inner spacers 404 are the same height as the spacers 232 and have a width of about 0.1 nm to 0.5 μm.

The negative capacitance layer 236 is formed between the inner spacers 404 (block 310). Optionally, the work function layer 238 is formed over the negative capacitance layer 236 (block 312) to form intermediate product 400C illustrated in FIG. 4C. In an exemplary aspect, the negative capacitance layer 236 and the work function layer 238 are formed by conformally depositing a Hafnium zirconium oxide ($HfZrO_2$) material and a titanium aluminum nitride (TiAlN) material, respectively. In exemplary aspects, the negative capacitance layer 236 may be about 0.1 nm to 10 nm thick and the work function layer 238 may be about 1 nm to 10 nm thick. The negative capacitance layer 236 and the work function layer 238 collectively form a pocket 410 in the void 402.

A portion 412 of the gate electrode 230 is formed over the negative capacitance layer 236 (block 314) and, more particularly, is formed inside the pocket 410 formed by the negative capacitance layer 236 and the work function layer 238. The extra portions of the negative capacitance layer 236 and the work function layer 238 are then removed (block 316) to create intermediate product 400D illustrated in FIG. 4D. This removal may be done through etching or chemical mechanical polishing (CMP).

The inner spacers 404 are then removed (block 318). This removal may be done by etching using an etchant that has an etch selectivity to not etch other portions of the device under construction. The vertical portions of the negative capacitance layer 236 are then removed (block 320) to create intermediate product 400E illustrated in FIG. 4E. This removal may be done with another etchant having an appropriate etch selectivity. Note that this may create a gap G1 of approximately 0.1 nm to 50 nm between the edge of the negative capacitance layer 236 and each of the spacers 232.

Figure 4F:
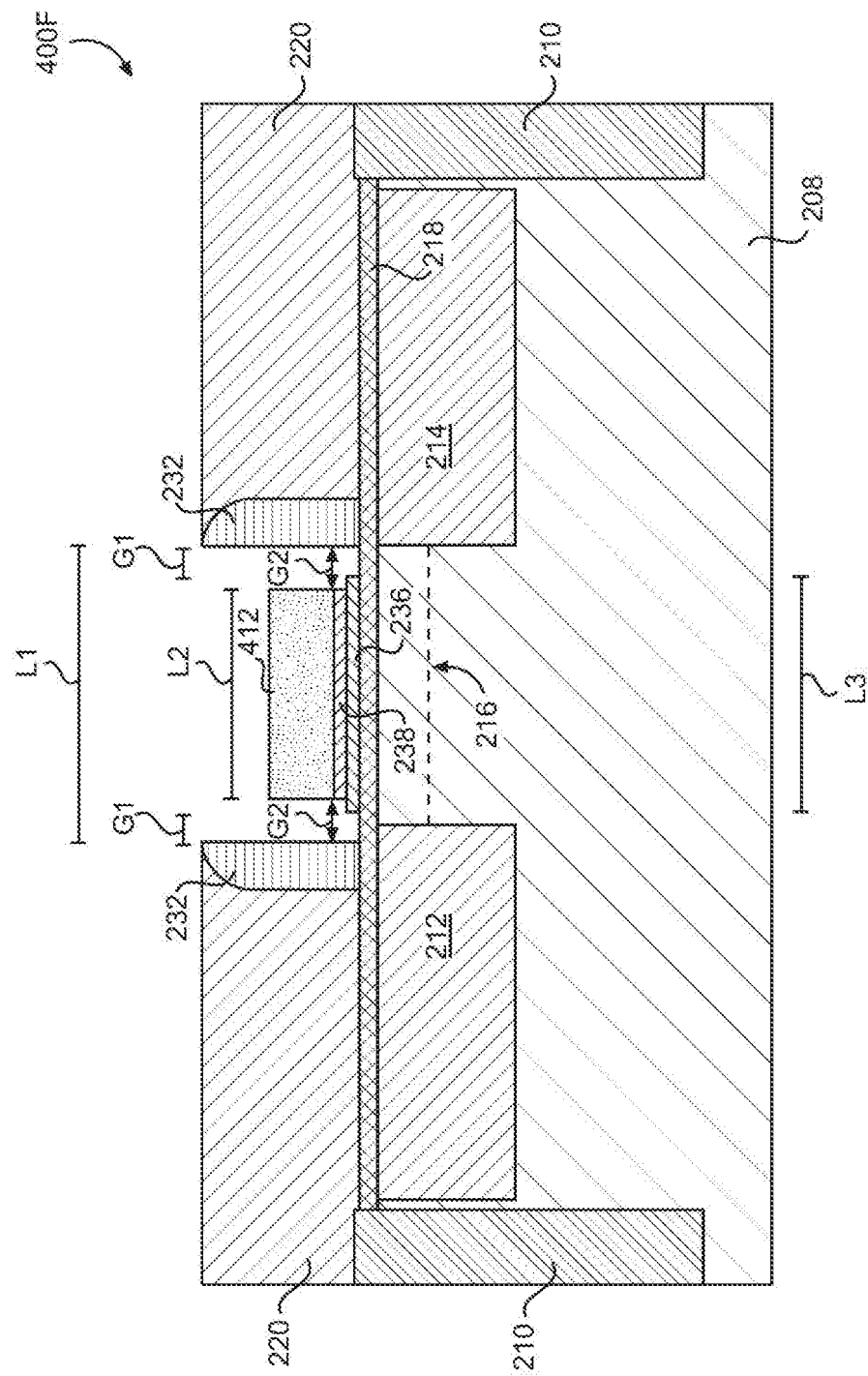
FIG. 4F is a cross-sectional, side elevational view diagram illustrating an exemplary process stage of removing portions of a work function layer during gate stack formation according to the exemplary fabrication process in FIG. 3.

The vertical portions of the work function layer 238 are then removed (block 322) to form intermediate product 400F illustrated in FIG. 4F. In an exemplary aspect, this creates a gap G2 of between 1 nm and 50 nm between the edge of the work function layer 238 and each of the spacers 232. In an exemplary aspect, the ratio of the gap G1 to the gap G2 is approximately 0.9 to 0.99. Again, this removal may be done with a selective etchant. It should be appreciated that this sequential selective etching creates a tiered structure of the negative capacitance layer 236 and the work function layer 238, where the work function layer 238 has the length L2 shorter than the length L3 of the negative capacitance layer 236. In an exemplary aspect, the length L3 is approximately 0.1 nm to 10 nm and the length L2 is 1 nm to 10 nm. In an exemplary aspect, the ratio of the length L2 to the length L3 is approximately 0.9 to 0.99. In another exemplary aspect, the length L2 is approximately two-thirds the length of L3. By selecting the length L3 appropriately, the capacitance of the negative capacitance layer 236 may be negatively correlated to the oxide capacitance of the FET 200. As noted above, in an exemplary aspect, the difference between the capacitance of the negative capacitance layer 236 and the insulation layer 218 approaches zero such that the overall capacitance is relatively large and an appropriately high-power density is effectuated.

Figure 4G:
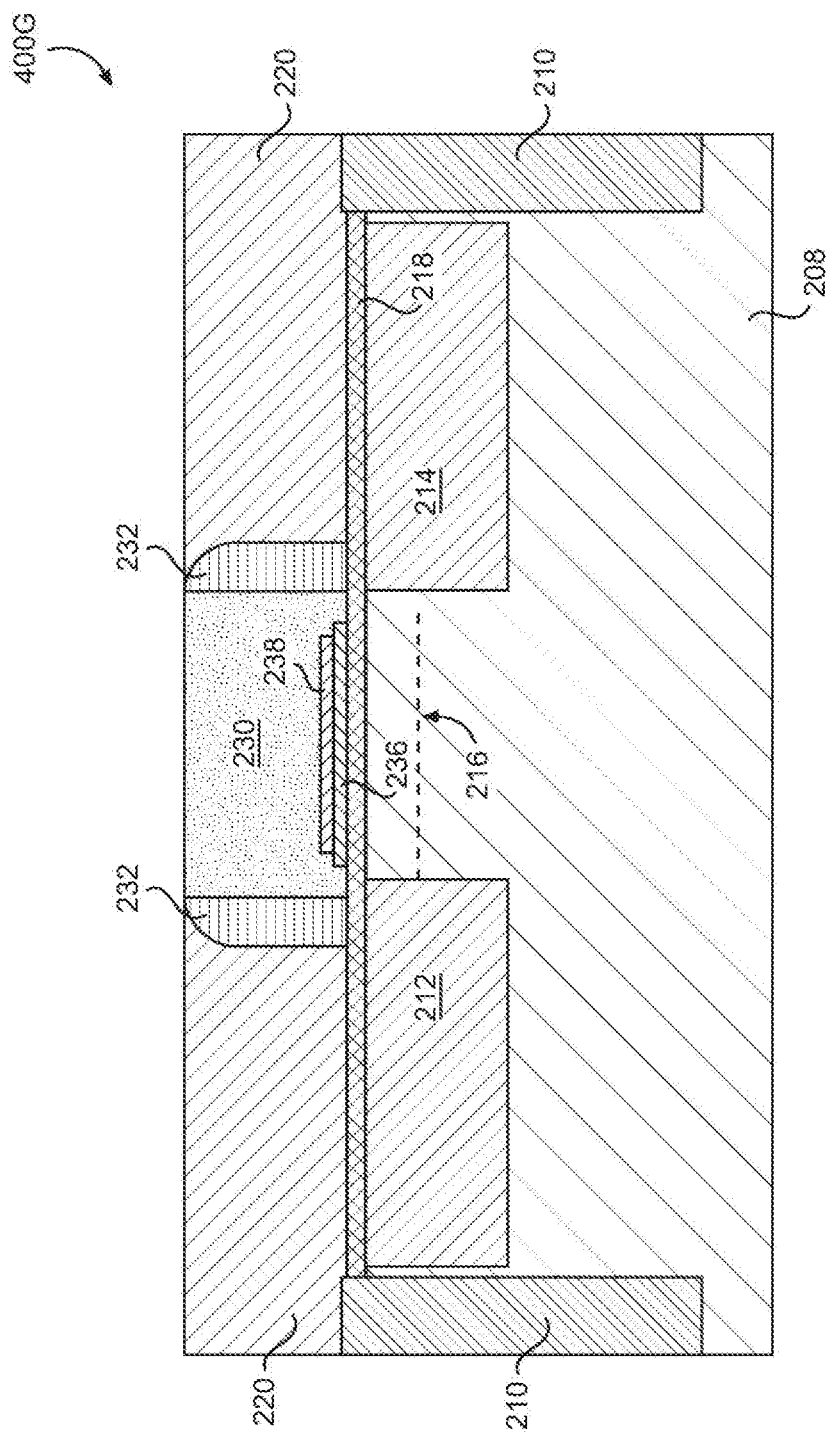
FIG. 4G is a cross-sectional, side elevational view diagram illustrating an exemplary process stage of filling the gate metal during gate stack formation according to the exemplary fabrication process in FIG. 3.

The space over and around the portion 412 of the gate electrode 230 is then filled (block 324) to make the full gate electrode 230 as illustrated by intermediate product 400G in FIG. 4G. In an exemplary aspect, the gate electrode 230 is tungsten (W). The gate electrode 230 covers the top surface of the work function layer 238 and the exposed surfaces of the negative capacitance layer 236 and extends upwardly, in an exemplary aspect, to a height of about 0.5 μm to 10 μm. Given the height of the gate electrode 230, it should be appreciated that the spacers 232 may be in the same range and generally have the same height at as the gate electrode 230. Further, the gate electrode 230 is, at the exterior edges, in contact with the insulation layer 218. In an exemplary aspect, the ratio of the length L2 or the length L3 to the length L1 is approximately 0.9 to 0.99.

After block 324, the source 202 and the drain 204 may be added along with appropriate contacts as is well understood until the FET 200 is finished. The length L1 may be about 5 nm to 1 μm. The gate oxide thickness may be about 1 nm to 10 nm. The substrate doping may be about $1 \times 10^{17}$ cm$^3$ and the result is a single gate, mostly symmetric structure.

While the above discussion focuses on a symmetric FET 200, the present disclosure is not so limited. Aspects of the present disclosure may also be used to create a laterally diffused MOSFET (LDMOS). An LDMOS is an asymmetric power MOSFET designed for low on-resistance and high blocking voltage. These features are obtained by creating a diffused p-type channel region in a low-doped n-type drain region. The low doping on the drain side results in a large depletion layer with high blocking voltage. The channel region diffusion can be defined with the same mask as the source region, resulting in a short channel with high current handling capability.

An exemplary LDMOS 500 is illustrated in FIG. 5. The LDMOS 500 is a three-terminal device that includes a source 502, a drain 504, and a gate 506 over a substrate 508 between two shallow trench isolation (STI) regions 510. The substrate 508 includes an n-type source region 512 under the source 502 and an n-type drain region 514 under the drain 504. The source 502 may sometimes be referred to as a means for providing electrical current over and coupled to the source region 512. Likewise, the drain 504 may sometimes be referred to as a means for providing electrical current over and coupled to the drain region 514. An insulation layer 518, typically made of SiO$_2$, is disposed between the gate 506 and the substrate 508. The insulation layer 518 may sometimes be referred to as a means for insulating. A dielectric material layer 520 is disposed over the insulation layer 518. Contacts 522 and 524 are disposed in the insulation layer 518 and below electrodes 526 and 528 of the source 502 and the drain 504, respectively. A gate electrode 530 is disposed between two spacers 532.

Collectively, the gate 506 and the gate electrode 530 form a gate stack 534. Within the gate electrode 530, a negative capacitance layer 536 is positioned on top of and adjacent to (or directly positioned on) the insulation layer 518. A work function layer 538 is positioned on top of and adjacent to (or directly positioned on) the negative capacitance layer 536. The position and function of the negative capacitance layer 536 is nearly identical to the negative capacitance layer 236 described above.

In contrast to the substrate 208, the substrate 508 may include a first doped zone 508A that is relatively lightly p+ doped (e.g., $10 \times 10^{20}$ cm$^3$) and a second doped zone 508B that is more heavily p– doped (e.g., $10 \times 10^{17}$ cm$^3$). The second doped zone 508B may sometimes be referred to as a buffer zone. A third zone 508C may be doped with an n-type material (e.g., $10 \times 10^{16}$ cm$^3$). A sinker 516 made of a p+ doped material may be present proximate the source region 512. Further, the source region 512 may be embedded in a p-well lateral diffusion zone 540. A p+ doped region 542 may be adjacent to the source region 512 in the p-well lateral diffusion zone 540. The drain 504 may include a lightly doped region 544 and a moderately doped region 546 that blend into the relatively heavily doped drain region 514.

The FET 200 and the LDMOS 500 according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
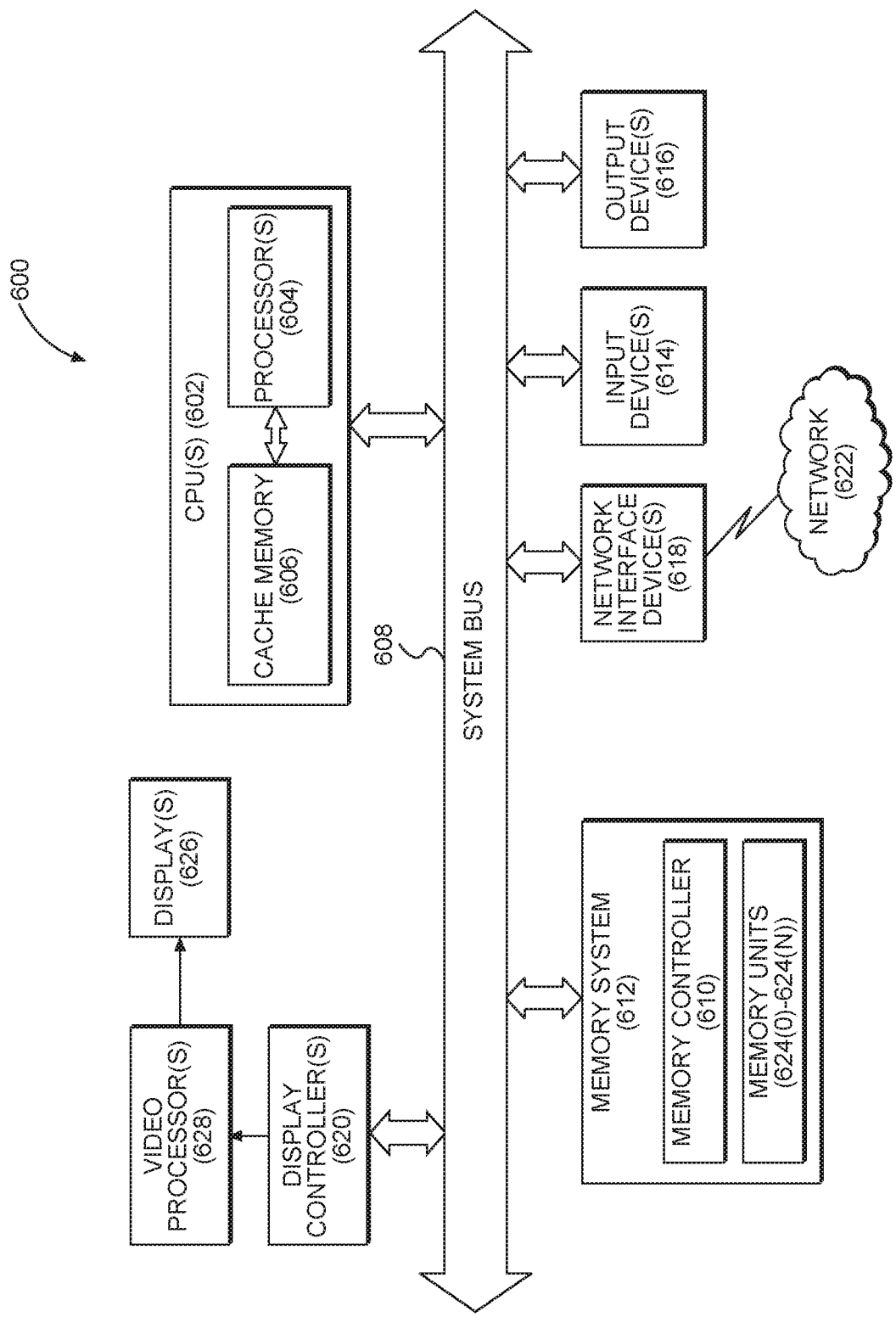
FIG. 6 is a block diagram of an exemplary processor-based system that can include the FET of FIG. 2A or the LDMOS of FIG. 5 with a negative capacitance layer formed according to the process of FIG. 3.

In this regard, FIG. 6 illustrates an example of a processor-based system 600 that can employ the FET 200 illustrated in FIGS. 2A and 2B and the LDMOS 500 illustrated in FIG. 5. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any devices configured to allow exchange of data to and from a network 622. The network 622 can be any type of network, including networks such as the phone network and the Internet. The network interface device(s) 618 can be configured to support any type of communications protocol desired. The memory system 612 can include one or more memory units 624(0)-624(N).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A Field-Effect Transistor (FET), comprising:
   a substrate including a source region, a drain region, and a channel region between the source region and the drain region;
   a source over and coupled to the source region;
   a drain over and coupled to the drain region; and
   a gate stack over the channel region, the gate stack comprising:
   a gate;
   a gate electrode having a first length between a first spacer and a second spacer;
   a planar negative capacitance layer below the gate electrode, the planar negative capacitance layer having a second length less than the first length;
   a planar work function layer defining a plane directly over the planar negative capacitance layer and in contact with the gate electrode, wherein the planar work function layer has a third length less than the second length such that a shoulder is formed by the planar negative capacitance layer, the shoulder having an upper surface parallel to the plane wherein the upper surface of the shoulder of the planar negative capacitance layer contacts the gate electrode; and
   a planar insulation layer directly below the planar negative capacitance layer and over the channel region, wherein the planar insulation layer extends at least the first length and is in contact with the gate electrode.

2. The FET of claim 1, wherein the FET is a laterally displaced metal oxide semiconductor (LDMOS) FET.

3. The FET of claim 1, wherein the gate electrode comprises:
   a first portion of the gate electrode over a first portion of a top surface of the planar insulation layer;
   a second portion of the gate electrode over a second portion of the top surface of the planar insulation layer; and
   a third portion of the gate electrode over the planar negative capacitance layer.

4. The FET of claim 1, wherein the gate electrode comprises:
   a first portion of the gate electrode directly on a first portion of a top surface of the planar insulation layer;
   a second portion of the gate electrode directly on a second portion of the top surface of the planar insulation layer; and
   a third portion of the gate electrode over the planar negative capacitance layer.

5. The FET of claim 1, wherein the gate electrode comprises:
   a first portion of the gate electrode over a first portion of a top surface of the planar insulation layer having a first portion length defined from an inner wall of the first spacer to the planar negative capacitance layer;
   a second portion of the gate electrode over a second portion of the top surface of the planar insulation layer having a second portion length defined from an inner wall of the second spacer to the planar negative capacitance layer approximately the same as the first portion length; and
   a third portion of the gate electrode over the planar negative capacitance layer having the second length.

6. The FET of claim 5, wherein the first length is between approximately 1 nanometer (nm) and 10 micrometers (μm), and the second length is between approximately 0.1 nm and 10 nm.

7. The FET of claim 1, wherein:
the planar insulation layer has a first capacitance associated with a difference between the first length and the second length; and
the planar negative capacitance layer has a second capacitance associated with the second length.

8. The FET of claim 7, wherein a difference between the first capacitance and the second capacitance is negatively correlated with an oxide capacitance of the FET.

9. The FET of claim 7, wherein a difference between the first capacitance and the second capacitance is less than one.

10. The FET of claim 1, wherein the planar negative capacitance layer comprises a negative capacitance material able to decrease an amount of stored charge of the planar negative capacitance layer in response to an increase in a voltage across the planar negative capacitance layer.

11. The FET of claim 10, wherein the FET is a planar FET having the gate electrode over only one side of the channel region and the planar negative capacitance layer is directly on the planar insulation layer.

12. The FET of claim 11, wherein the gate electrode comprises:
a first portion of the gate electrode over a first portion of a top surface of the planar insulation layer having a first portion length defined from an inner wall of the first spacer to the planar negative capacitance layer;
a second portion of the gate electrode over a second portion of the top surface of the planar insulation layer having a second portion length defined from an inner wall of the second spacer to the planar negative capacitance layer approximately the same as the first portion length; and
a third portion of the gate electrode over the planar negative capacitance layer having the second length;
wherein:
the planar insulation layer has a first capacitance associated with a difference between the first length and the second length; and
the planar negative capacitance layer has a second capacitance associated with the second length.

13. The FET of claim 12, wherein a difference between the first capacitance and the second capacitance is negatively correlated with an oxide capacitance of the FET.

14. The FET of claim 12, wherein a difference between the first capacitance and the second capacitance is less than one.

15. The FET of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *